(12) United States Patent
Honjo et al.

(10) Patent No.: US 8,913,969 B1
(45) Date of Patent: Dec. 16, 2014

(54) FAST AMPLITUDE BASED PRE-DISTORTION CALIBRATION FOR A RADIO FREQUENCY POWER AMPLIFIER

(75) Inventors: Hirofumi Honjo, Fountain Hills, AZ (US); Suryanarayana Pappu, Gilbert, AZ (US); Mikko Sannala, San Jose, CA (US); Ricke W. Clark, Irvine, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 1005 days.

(21) Appl. No.: 12/785,027

(22) Filed: May 21, 2010
(Under 37 CFR 1.47)

Related U.S. Application Data

(60) Provisional application No. 61/180,269, filed on May 21, 2009.

(51) Int. Cl.
*H04B 1/04* (2006.01)
(52) U.S. Cl.
USPC .............. 455/114.3; 455/114.2; 455/115.1; 455/115.2; 455/115.3; 455/67.11; 455/67.13; 455/67.14; 455/67.16; 455/69
(58) Field of Classification Search
USPC .......... 455/114.2, 114.3, 115.1–115.3, 67.11, 455/67.13, 67.14, 67.16, 69
See application file for complete search history.

(56) References Cited

U.S. PATENT DOCUMENTS

| | | | |
|---|---|---|---|
| 7,333,781 B1 * | 2/2008 | Stockstad et al. | 455/126 |
| 7,450,916 B1 * | 11/2008 | Hietala et al. | 455/127.2 |
| 7,529,523 B1 * | 5/2009 | Young et al. | 455/115.1 |
| 7,894,772 B2 * | 2/2011 | Aoki | 455/63.1 |
| 7,962,108 B1 * | 6/2011 | Khlat et al. | 455/114.3 |
| 8,014,735 B2 * | 9/2011 | Vinayak et al. | 455/114.3 |
| 2003/0215025 A1 * | 11/2003 | Hietala | 375/297 |
| 2007/0190952 A1 * | 8/2007 | Waheed et al. | 455/114.3 |

* cited by examiner

*Primary Examiner* — Junpeng Chen
(74) *Attorney, Agent, or Firm* — Withrow & Terranova, P.L.L.C.

(57) ABSTRACT

The present disclosure relates to amplitude based pre-distortion calibration of an RF communications terminal, such as a cell phone, by transmitting a first standard RF transmit burst from the RF communications terminal to an RF test instrument, which assimilates the first standard RF transmit burst. A calibration control system extracts information regarding the first standard RF transmit burst from the RF test instrument; determines amplitude based distortion of the RF communications terminal using the extracted information; determines amplitude based pre-distortion calibration information using the determined amplitude based distortion; and calibrates the RF communications terminal using the amplitude based pre-distortion calibration information. By using a single-shot transmit burst, calibration times may be minimized. To calibrate the RF communications terminal at multiple transmit frequencies, multiple single-shot transmit bursts may be used, such that each single-shot transmit burst is at a different calibration frequency.

24 Claims, 14 Drawing Sheets

FAST AMPLITUDE BASED PRE-DISTORTION CALIBRATION FOR A RADIO FREQUENCY POWER AMPLIFIER

This application claims the benefit of provisional patent application Ser. No. 61/180,269, filed May 21, 2009 the disclosure of which is hereby incorporated herein by reference in its entirety.

FIELD OF THE DISCLOSURE

Embodiments of the present disclosure relate to the calibration of amplitude based pre-distortion as applied to radio frequency (RF) power amplifiers used in RF communications terminals.

BACKGROUND OF THE DISCLOSURE

With the growth of the wireless communications industry, wireless communications protocols become more sophisticated and demanding in their requirements for complex modulation schemes and narrow channel bandwidths. The ultimate goal is to encode as much digital information as possible in a given channel. One such modulation scheme for encoding digital information is polar modulation. Polar modulated RF transmitters utilize both amplitude modulation (AM) and phase modulation (PM) to maximize the amount of information that can be encoded with minimum bandwidth. By using multiple combinations of phase and amplitude modulation, multiple digital bits of information can be represented. Large signal amplitude modulation allows several distinct levels of modulation with adequate noise margins for reliable encoding of digital data.

In a polar modulated system, AM can affect proper operation of an RF power amplifier in an RF communications terminal due to non-linearities of the RF power amplifier. As a result, the RF power amplifier may have amplitude based distortions. One type of amplitude based distortion is called AM to AM distortion, which may be present when the RF power amplifier has a non-linear gain with varying output power. Another type of amplitude based distortion is called AM to PM distortion, which may be present when an amplitude signal that controls the RF power amplifier causes unwanted phase components to be created due to the non-linearities of the RF power amplifier.

To compensate for AM to AM distortion, the amplitude signal that controls the RF power amplifier may be pre-distorted using AM to AM pre-distortion. However, to determine the appropriate AM to AM pre-distortion that will correctly compensate for the AM to AM distortion of the RF power amplifier may require a calibration process to adequate characterize the AM to AM distortion and then determine the appropriate AM to AM pre-distortion to compensate for the AM to AM distortion. Similarly, to compensate for AM to PM distortion, a phase modulated RF signal to the RF power amplifier may be pre-distorted using AM to PM pre-distortion. However, to determine the appropriate AM to PM pre-distortion that will correctly compensate for the AM to PM distortion of the RF power amplifier may require a calibration process to adequate characterize the AM to PM distortion and then determine the appropriate AM to PM pre-distortion to compensate for the AM to PM distortion. Costs of calibration processes in production environments tend to be directly related to calibration set-up and execution times. Thus, there is a need for amplitude based pre-distortion calibration of an RF communications terminal that minimizes calibration set-up and execution times.

SUMMARY OF THE EMBODIMENTS

The present disclosure relates to amplitude based pre-distortion calibration of an RF communications terminal, such as a cell phone, by transmitting a first standard RF transmit burst from the RF communications terminal to an RF test instrument, which assimilates the first standard RF transmit burst. A calibration control system extracts information regarding the first standard RF transmit burst from the RF test instrument; determines amplitude based distortion of the RF communications terminal using the extracted information; determines amplitude based pre-distortion calibration information using the determined amplitude based distortion; and calibrates the RF communications terminal using the amplitude based pre-distortion calibration information. By using a single-shot transmit burst, calibration times may be minimized. To calibrate the RF communications terminal at multiple transmit frequencies, multiple single-shot transmit bursts may be used, such that each single-shot transmit burst is at a different calibration frequency.

The amplitude based pre-distortion may include amplitude modulation (AM) to AM pre-distortion, AM to phase modulation (PM) pre-distortion, or both. As such, the extracted information may include amplitude information, phase information, or both; the amplitude based distortion of the RF communications terminal may include AM to AM distortion, AM to PM distortion, or both; and the amplitude based pre-distortion calibration information may include AM to AM pre-distortion calibration information, AM to PM pre-distortion calibration information, or both.

One embodiment of the present disclosure is a calibration method to measure an output amplitude and phase of an RF power amplifier of the RF communications terminal as a function of an input control voltage to the power amplifier over the dynamic range of the power amplifier in one measurement sweep. Deviations from an expected output amplitude and an expected phase of the power amplifier are then determined, and appropriate pre-distortion calibration information is determined, based on the deviations, and fed to pre-distortion circuitry in the RF communications terminal to minimize further deviations from the expected output amplitude and expected phase of the power amplifier.

The RF communications terminal may include a Global System for Mobile Communications (GSM) transceiver, an Enhanced Data GSM Environment (EDGE) transceiver, or a combination GSM/EDGE transceiver. The single-shot transmit burst may be a standard RF transmit burst, which may be a standard GSM or EDGE transmit burst. The standard RF transmit burst may be adapted to encompass the dynamic range of the power amplifier. The RF test instrument may be commercially available, such that only basic signal capture features are used and no special instrument features are required. By using a single-shot transmit burst, multiple iterations or binary searches may be eliminated and only basic signal capture features are needed. As a result, the disclosed calibration method may be fast and repeatable, and may provide a desired level of accuracy over the dynamic range while meeting spectrum performance requirements of the power amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
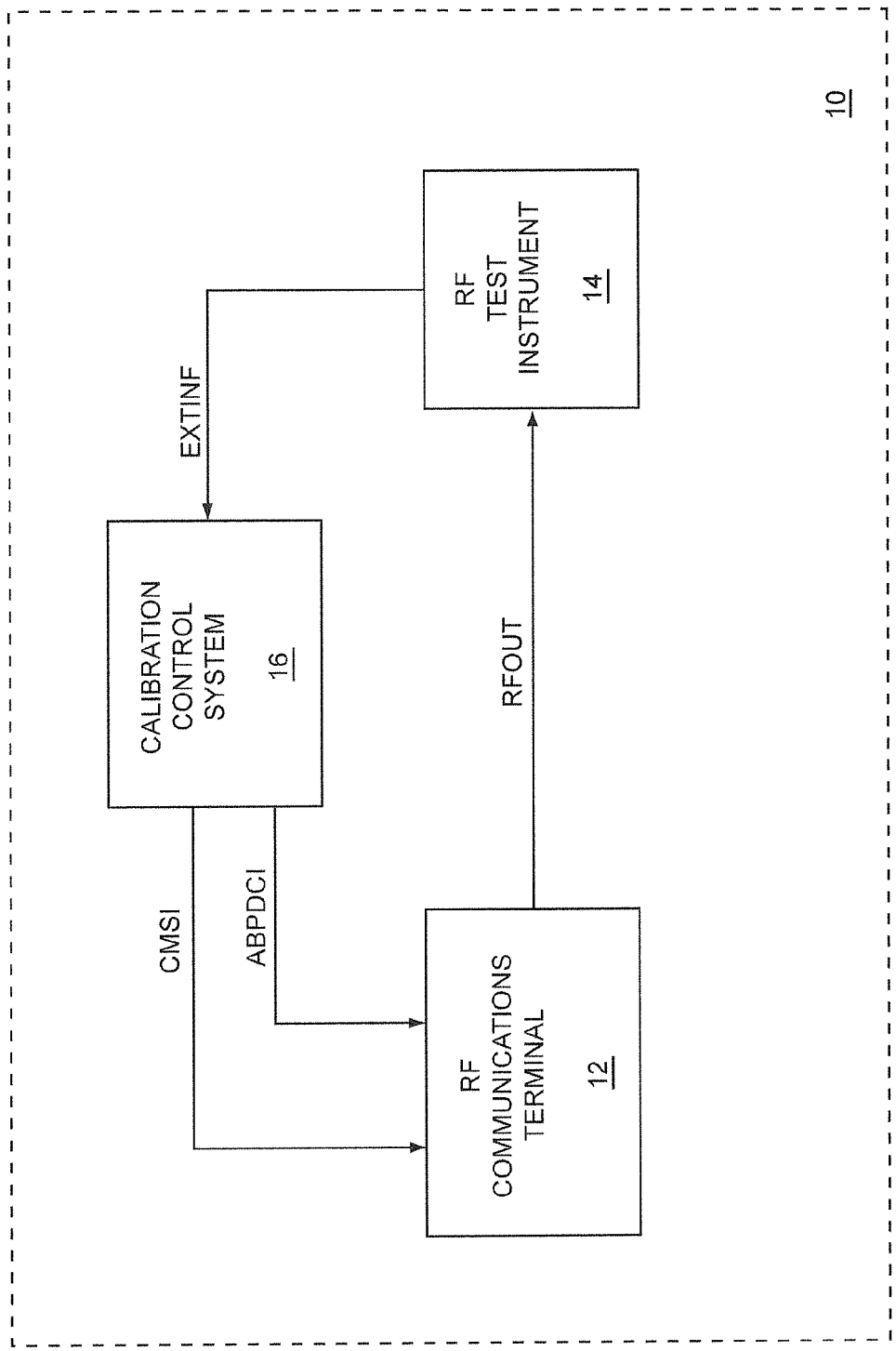
FIG. 1 shows a system according to one embodiment of the present disclosure.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to amplitude based pre-distortion calibration of an RF communications terminal, such as a cell phone, by transmitting a first standard RF transmit burst from the RF communications terminal to an RF test instrument, which assimilates the first standard RF transmit burst. A calibration control system extracts information regarding the first standard RF transmit burst from the RF test instrument; determines amplitude based distortion of the RF communications terminal using the extracted information; determines amplitude based pre-distortion calibration information using the determined amplitude based distortion; and calibrates the RF communications terminal using the amplitude based pre-distortion calibration information. By using a single-shot transmit burst, calibration times may be minimized. To calibrate the RF communications terminal at multiple transmit frequencies, multiple single-shot transmit bursts may be used, such that each single-shot transmit burst is at a different calibration frequency.

The amplitude based pre-distortion may include amplitude modulation (AM) to AM pre-distortion, AM to phase modulation (PM) pre-distortion, or both. As such, the extracted information may include amplitude information, phase information, or both; the amplitude based distortion of the RF communications terminal may include AM to AM distortion, AM to PM distortion, or both; and the amplitude based pre-distortion calibration information may include AM to AM pre-distortion calibration information, AM to PM pre-distortion calibration information, or both.

One embodiment of the present disclosure is a calibration method to measure an output amplitude and phase of an RF power amplifier of the RF communications terminal as a function of an input control voltage to the power amplifier over the dynamic range of the power amplifier in one measurement sweep. Deviations from an expected output amplitude and an expected phase of the power amplifier are then determined, and appropriate pre-distortion calibration information is determined, based on the deviations, and fed to pre-distortion circuitry in the RF communications terminal to minimize further deviations from the expected output amplitude and expected phase of the power amplifier.

The RF communications terminal may include a Global System for Mobile Communications (GSM) transceiver, an Enhanced Data GSM Environment (EDGE) transceiver, or a combination GSM/EDGE transceiver. The single-shot transmit burst may be a standard RF transmit burst, which may be a standard GSM or EDGE transmit burst. The standard RF transmit burst may be adapted to encompass the dynamic range of the power amplifier. The RF test instrument may be commercially available, such that only basic signal capture features are used and no special instrument features are required. By using a single-shot transmit burst, multiple iterations or binary searches may be eliminated and only basic signal capture features are needed. As a result, the disclosed calibration method may be fast and repeatable, and may provide a desired level of accuracy over the dynamic range while meeting spectrum performance requirements of the power amplifier.

FIG. 1 shows a system 10 according to one embodiment of the present disclosure. The system 10 includes an RF communications terminal 12 to be calibrated, an RF test instrument 14, and a calibration control system 16. The calibration control system 16 controls the calibration process and provides calibration mode selection information CMSI to the RF communications terminal 12 to prepare the RF communications terminal 12 for amplitude-based pre-distortion calibration. The calibration control system 16 selects between normal operation and calibration operation and the calibration mode selection information CMSI indicates whether normal operation or calibration operation is selected. The RF communications terminal 12 provides a polar modulated RF output signal RFOUT to the RF test instrument 14. During the calibration node, the RF communications terminal 12 transmits one or more single-shot RF transmit bursts to the RF test instrument 14 via the polar modulated RF output signal RFOUT. The RF test instrument 14 assimilates the RF transmit bursts. Then, the calibration control system 16 extracts information regarding the RF transmit bursts from the RF test instrument 14 and then determines amplitude based pre-distortion calibration information ABPDCI based on the extracted information. The calibration control system 16 provides the amplitude based pre-distortion calibration information ABPDCI to the RF communications terminal 12, which uses the amplitude based pre-distortion calibration information ABPDCI to update amplitude based calibration circuitry (not shown), calibration constants, calibration coefficients, or the like, in the RF communications terminal 12. The RF test instrument 14 may be a commercially available RF test instrument, such as a Rohde&Swartz® Model CMU-200 or an Agilent® Model 4406 Vector Signal Analyzer. In alternate embodiments of the RF communications terminal 12, the polar modulated RF output signal RFOUT may be replaced with an RF output signal having modulation other than polar modulation, such as amplitude modulation, phase modulation, frequency modulation, the like, or any combination thereof.

Figure 2:
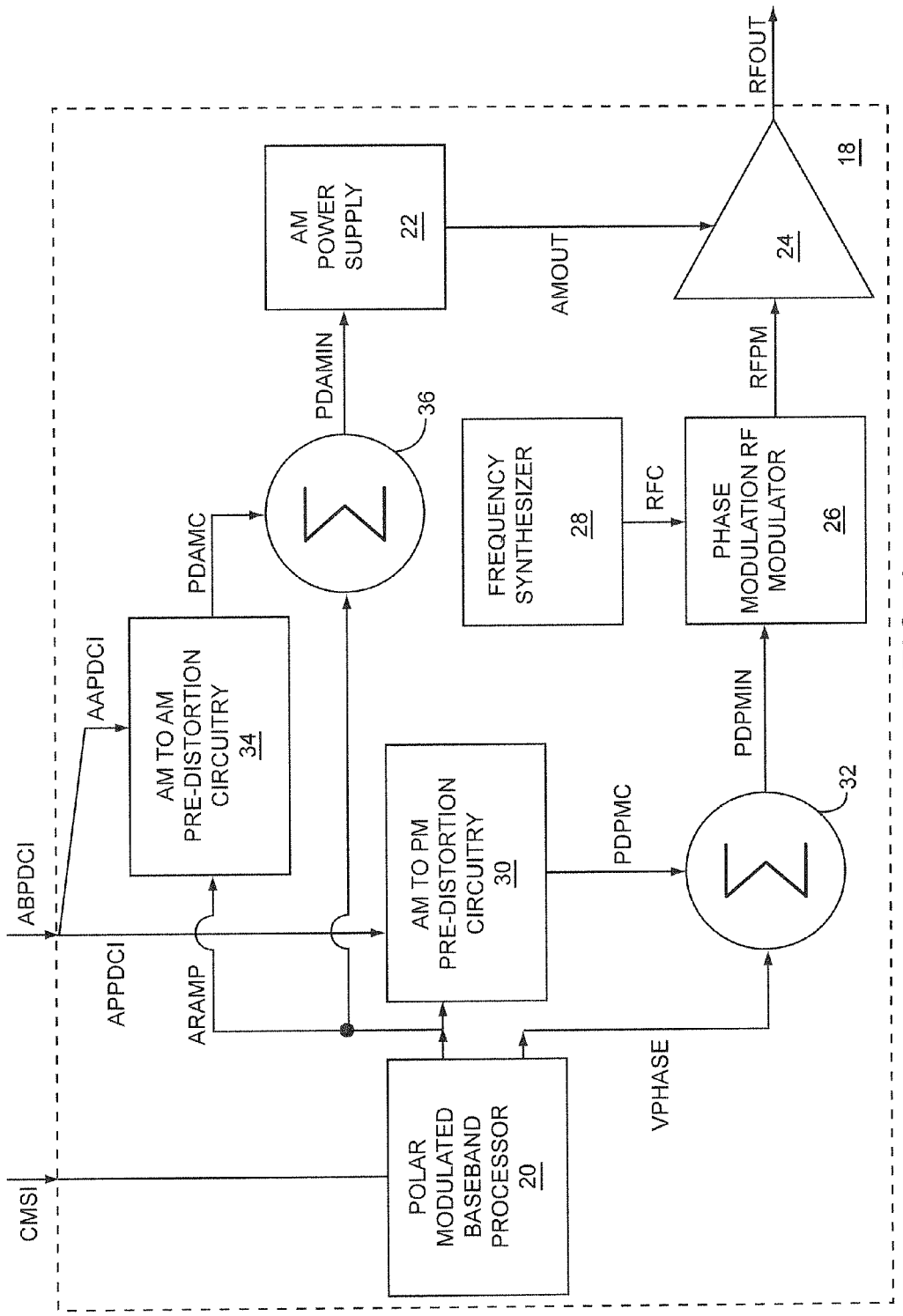
FIG. 2 shows RF transmitter circuitry, which is part of an RF communications terminal illustrated in FIG. 1 according to one embodiment of the RF transmitter circuitry.

FIG. 2 shows RF transmitter circuitry 18, which is part of the RF communications terminal 12 illustrated in FIG. 1 according to one embodiment of the RF transmitter circuitry 18. The RF transmitter circuitry 18 includes a polar modulated baseband processor 20, an AM power supply 22, an RF power amplifier 24, a phase modulation RF modulator 26, a frequency synthesizer 28, AM to PM pre-distortion circuitry 30, a PM pre-distortion summing circuit 32, AM to AM pre-distortion circuitry 34, and an AM pre-distortion summing circuit 36. The polar modulated baseband processor 20 provides an AM control signal ARAMP to the AM to PM pre-distortion circuitry 30, to the AM to AM pre-distortion circuitry 34, and to the AM pre-distortion summing circuit 36.

The AM to AM pre-distortion circuitry 34 provides a pre-distortion AM correction signal PDAMC to the AM pre-distortion summing circuit 36 based on pre-distorting the AM control signal ARAMP. The AM pre-distortion summing circuit 36 adds the pre-distortion AM correction signal PDAMC to the AM control signal ARAMP to create a pre-distorted AM control signal PDAMIN, which is provided to the AM power supply 22. The AM power supply 22 provides a pre-distorted AM supply voltage AMOUT to the RF power amplifier 24. The pre-distorted AM supply voltage AMOUT may be proportional to the pre-distorted AM control signal PDAMIN. The pre-distortion AM correction signal PDAMC is based on the AM control signal ARAMP and AM to AM calibration information, which may include AM to AM calibration constants. The AM to AM calibration constants may include AM to AM pre-distortion coefficients, which may be used with polynomials to determine the pre-distortion AM correction signal PDAMC. In an alternate embodiment of the RF transmitter circuitry 18, the AM pre-distortion summing circuit 36 may be replaced with other circuitry to combine the pre-distortion AM correction signal PDAMC and the AM control signal ARAMP to create the pre-distorted AM control signal PDAMIN. The pre-distorted AM supply voltage AMOUT may be proportional to the AM control signal ARAMP. The AM power supply 22 may include DC-to-DC conversion circuitry, linear power supply circuitry, or both.

The polar modulated baseband processor 20 provides a phase modulation control signal VPHASE to the PM pre-distortion summing circuit 32. The AM to PM pre-distortion circuitry 30 provides a pre-distortion PM correction signal PDPMC to the PM pre-distortion summing circuit 32 based on pre-distorting the AM control signal ARAMP. The PM pre-distortion summing circuit 32 adds the pre-distortion PM correction signal PDPMC to the PM control signal VPHASE to create a pre-distorted PM control signal PDPMIN, which is provided to the phase modulation RF modulator 26. The frequency synthesizer 28 provides an RF carrier signal RFC to the phase modulation RF modulator 26, which provides a PM RF signal RFPM to the RF power amplifier 24. The phase modulation RF modulator 26 uses the pre-distorted PM control signal PDPMIN to phase modulate the RF carrier signal RFC to create the PM RF signal RFPM. The RF power amplifier 24 provides the polar modulated RF output signal RFOUT. The carrier frequency of the polar modulated RF output signal RFOUT is essentially the frequency of the RF carrier signal RFC. The AM portion of the polar modulated RF output signal RFOUT is based on the pre-distorted AM supply voltage AMOUT and the PM portion of the polar modulated RF output signal RFOUT is based on the PM RF signal RFPM.

The pre-distorted PM control signal PDPMIN is used to phase modulate the RF carrier signal RFC to create the polar modulated RF output signal RFOUT. The pre-distortion PM correction signal PDPMC is based on the AM control signal ARAMP and AM to PM calibration information, which may include AM to PM calibration constants. The AM to PM calibration constants may include AM to PM pre-distortion coefficients, which may be used with polynomials to determine the pre-distortion PM correction signal PDPMC. In an alternate embodiment of the RF transmitter circuitry 18, the PM pre-distortion summing circuit 32 may be replaced with other circuitry to combine the pre-distortion PM correction signal PDPMC and the PM control signal VPHASE to create the pre-distorted PM control signal PDPMIN.

In an ideal polar modulated RF transmitter, the AM portion of the polar modulated RF output signal RFOUT is proportional to the AM control signal ARAMP; however, circuit characteristics may add offsets, non-linearities, or other anomalies. Further, in an ideal polar modulated RF transmitter, the PM portion of the polar modulated RF output signal RFOUT is not influenced by the AM control signal ARAMP; however, circuit characteristics may enable interactions with the AM control signal ARAMP. In alternate embodiments of the RF transmitter circuitry 18, either the AM to AM pre-distortion or the AM to PM pre-distortion may be omitted. As such, either the AM to AM pre-distortion circuitry 34 and the AM pre-distortion summing circuit 36, or the AM to PM pre-distortion circuitry 30 and the PM pre-distortion summing circuit 32 may be omitted. Alternate embodiments of the RF transmitter circuitry 18 may use other approaches to providing the AM, the PM, or both.

Each of the AM control signal ARAMP and the PM control signal VPHASE may be either an analog signal or a digital signal. As such, in one embodiment of the polar modulated baseband processor 20, the polar modulated baseband processor 20 includes a first digital-to-analog converter (DAC) to provide the AM control signal ARAMP and a second DAC to provide the PM control signal VPHASE. Alternate embodiments of the polar modulated baseband processor 20 may omit either or both of the first and the second DACs.

The polar modulated baseband processor 20 may receive the calibration mode selection information CMSI, which may include information instructing the polar modulated baseband processor 20 to select between normal operation and calibration operation. Further, the calibration mode selection information CMSI may include initialization information, such as selection of specific types of RE transmit bursts, synchronization information, such as when to initiate an RF transmit burst, selection of one or more calibration frequency, the like, or any combination thereof. The amplitude based pre-distortion calibration information ABPDCI may include AM to AM pre-distortion calibration information AAPDCI, which is provided to the AM to AM pre-distortion circuitry 34, may include AM to PM pre-distortion calibration information APPDCI, which is provided to the AM to PM pre-distortion circuitry 30, or both. During normal operation, the RF communications terminal 12 may transmit the polar modulated RF output signal RFOUT, which may be pre-distorted based on the AM to AM pre-distortion calibration information AAPDCI, may be based on the AM to PM pre-distortion calibration information APPDCI, or both.

Figure 3:
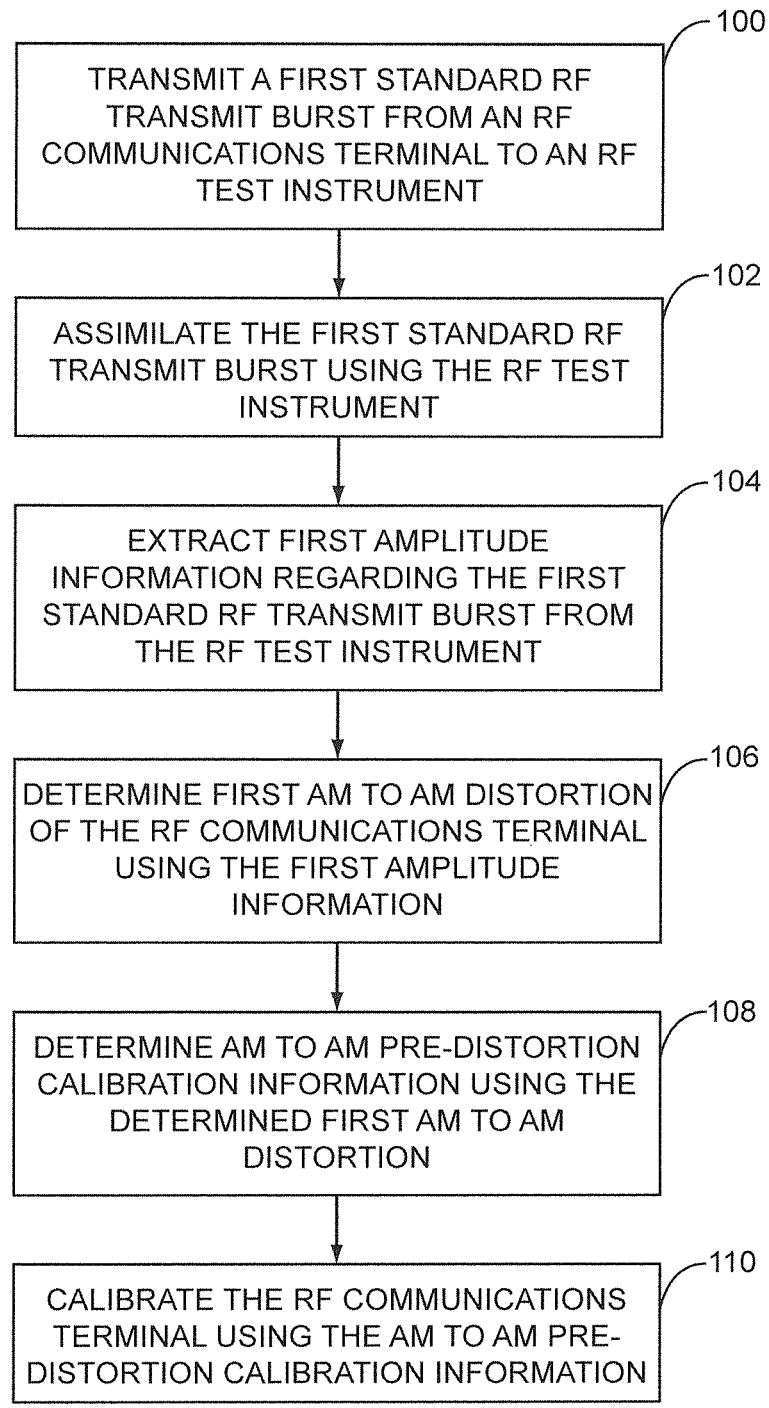
FIG. 3 shows a process for calibrating the RF communications terminal shown in FIG. 1 according to one embodiment of the system.

FIG. 3 shows a process for calibrating the RF communications terminal 12 shown in FIG. 1 according to one embodiment of the system 10. To begin the process, select calibration operation. The calibration control system 16 (FIG. 1) may be used to select calibration operation. During calibration operation, transmit a first standard RF transmit burst from the RF communications terminal 12 (FIG. 1) to the RF test instrument 14 (FIG. 1) (Step 100). The first standard RF transmit burst may be transmitted via the polar modulated RF output signal RFOUT (FIG. 1). The first standard RF transmit burst may be transmitted at a first calibration frequency. During calibration operation, assimilate the first standard RF transmit burst using the RF test instrument 14 (Step 102). Extract first amplitude information regarding the first standard RF transmit burst from the RF test instrument 14 (Step 104). The calibration control system 16 may be used to extract the first amplitude information during calibration operation. Determine first AM to AM distortion of the RF communications terminal 12 using the first amplitude information (Step 106). The calibration control system 16 may be used to determine the first AM to AM distortion during calibration operation. Determine AM to AM pre-distortion calibration information AAPDCI (FIG. 2) using the determined first AM to AM distortion (Step 108). The calibration control system 16 (FIG. 1) may be used to determine the AM to AM pre-distortion calibration information AAPDCI during calibration operation. To complete the process, calibrate the RF communications terminal 12 using the AM to AM pre-distortion calibration information AAPDCI (Step 110). The calibration control system 16 (FIG. 1) may be used to calibrate the RF communications terminal 12 during calibration operation by providing the AM to AM pre-distortion calibration information AAPDCI to the RF communications terminal 12.

In one embodiment of the first standard RF transmit burst, the first standard RF transmit burst is not a custom built waveform. In one embodiment of the first standard RF transmit burst, the first standard RF transmit burst is a standard GSM transmit burst. In one embodiment of the first standard RF transmit burst, the first standard RF transmit burst is a single-shot burst and the first amplitude information is a single-shot extraction. In one embodiment of the first standard RF transmit burst, an amplitude of the first standard RF transmit burst is modulated to span an amplitude operating range of the RF communications terminal 12. In one embodiment of the first standard RF transmit burst, an amplitude of the first standard RF transmit burst is modulated based on the AM control signal ARAMP, which may be an amplitude ramp signal. The amplitude ramp signal may be based on a programmable ramp, which may be based on a ramp profile. Determining the first AM to AM distortion may be based on differences between the first amplitude information and the ramp profile.

In one embodiment of the RF test instrument 14, the RF test instrument 14 is commercially available. In one embodiment of the RF test instrument 14, no custom instrument features of the RF test instrument 14 are used to assimilate the first standard RF transmit burst. In one embodiment of the RF test instrument 14, no custom instrument features of the RF test instrument 14 are used to extract the first amplitude information regarding the first standard RF transmit burst. In one embodiment of the RF test instrument 14, at least one basic signal capture feature of the RF test instrument 14 is used to assimilate the first standard RF transmit burst. In one embodiment of the RF test instrument 14, at least one basic signal capture feature of the RF test instrument 14 is used to extract the first amplitude information regarding the first standard RF transmit burst. In one embodiment of the RF test instrument 14, one basic signal capture feature of the RF test instrument 14 is used to for taking amplitude measurements of the first standard RF transmit burst.

Figure 4:
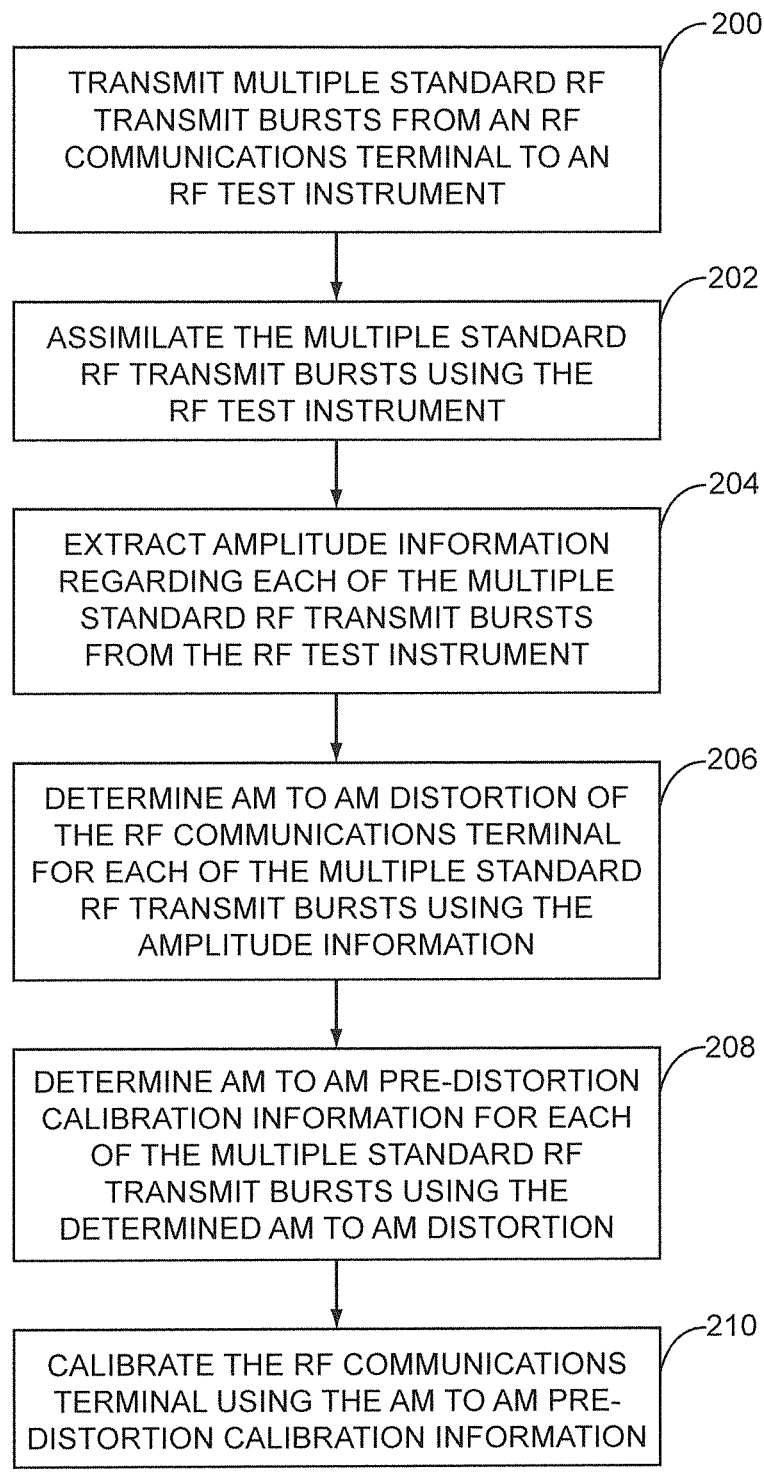
FIG. 4 shows a process for calibrating the RF communications terminal shown in FIG. 1 according to an alternate embodiment of the system.

FIG. 4 shows a process for calibrating the RF communications terminal 12 shown in FIG. 1 according to an alternate embodiment of the system 10. To begin the process, select calibration operation. The calibration control system 16 (FIG. 1) may be used to select calibration operation. During calibration operation, transmit multiple standard RF transmit bursts from the RF communications terminal 12 (FIG. 1) to the RF test instrument 14 (FIG. 1) (Step 200). The multiple standard RF transmit bursts may be transmitted via the polar modulated RF output signal RFOUT (FIG. 1). Each of the multiple standard RF transmit bursts may be transmitted at a corresponding calibration frequency. During calibration operation, assimilate the multiple standard RF transmit bursts using the RE test instrument 14 (Step 202). Extract amplitude information regarding the multiple standard RF transmit bursts from the RF test instrument 14 (Step 204).

The calibration control system 16 may be used to extract the amplitude information during calibration operation. Determine AM to AM distortion of the RF communications terminal 12 for each of the multiple standard RF transmit bursts using the first amplitude information (Step 206). The calibration control system 16 may be used to determine the AM to AM distortion for each of the multiple standard RF transmit bursts during calibration operation. Determine AM to AM pre-distortion calibration information AAPDCI (FIG. 2) for each of the multiple standard RF transmit bursts using the determined AM to AM distortion (Step 208). The calibration control system 16 (FIG. 1) may be used to determine the AM to AM pre-distortion calibration information AAPDCI during calibration operation. To complete the process, calibrate the RF communications terminal 12 using the AM to AM pre-distortion calibration information AAPDCI (Step 210). The calibration control system 16 may be used to calibrate the RF communications terminal 12 during calibration operation by providing the AM to AM pre-distortion calibration information AAPDCI to the RF communications terminal 12.

In one embodiment of the multiple standard RF transmit bursts, the multiple standard RF transmit bursts are not custom built waveforms. In one embodiment of the multiple standard RF transmit bursts, each of the multiple standard RF transmit bursts is a standard GSM transmit burst. In one embodiment of the multiple standard RF transmit bursts, each of the multiple standard RF transmit bursts is a single-shot burst and the amplitude information for each of the multiple standard RF transmit bursts is a single-shot extraction. In one embodiment of the multiple standard RF transmit bursts, an amplitude of each of the multiple standard RF transmit bursts is modulated to span an amplitude operating range of the RF communications terminal 12. In one embodiment of the multiple standard RF transmit bursts, an amplitude of each of the multiple standard RF transmit bursts is modulated based on the AM control signal ARAMP, which may be an amplitude ramp signal. The amplitude ramp signal may be based on a programmable ramp.

In one embodiment of the RF test instrument 14, the RF test instrument 14 is commercially available. In one embodiment of the RF test instrument 14, no custom instrument features of the RF test instrument 14 are used to assimilate each of the multiple standard RF transmit bursts. In one embodiment of the RF test instrument 14, no custom instrument features of the RF test instrument 14 are used to extract the amplitude information regarding the multiple standard RF transmit bursts. In one embodiment of the RF test instrument 14, at least one basic signal capture feature of the RF test instrument 14 is used to assimilate each of the multiple standard RF transmit bursts. In one embodiment of the RF test instrument 14, at least one basic signal capture feature of the RF test instrument 14 is used to extract the amplitude information regarding the multiple standard RF transmit bursts. In one embodiment of the RF test instrument 14, one basic signal capture feature of the RF test instrument 14 is used to for taking amplitude measurements of the multiple standard RF transmit bursts.

Figure 5:
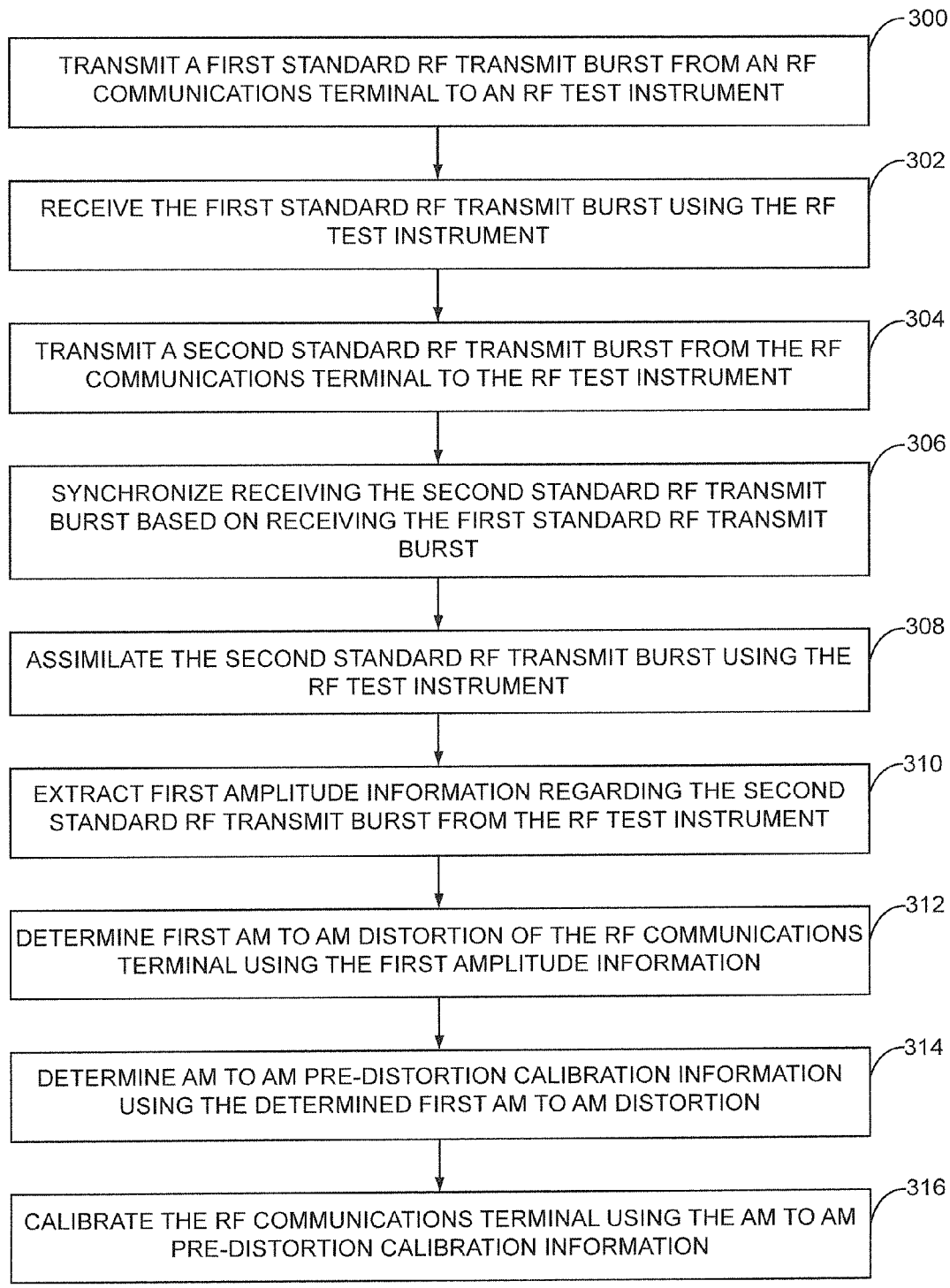
FIG. 5 shows a process for calibrating the RF communications terminal shown in FIG. 1 according to an additional embodiment of the system.

FIG. 5 shows a process for calibrating the RF communications terminal 12 shown in FIG. 1 according to an additional embodiment of the system 10. To begin the process, select calibration operation. The calibration control system 16 (FIG. 1) may be used to select calibration operation. During calibration operation, transmit a first standard RF transmit burst from the RF communications terminal 12 (FIG. 1) to the RF test instrument 14 (FIG. 1) (Step 300). The first standard RF transmit burst may be transmitted via the polar modulated RF output signal RFOUT (FIG. 1). During calibration operation, receive the first standard RF transmit burst using the RF test instrument 14 (Step 302). During calibration operation and after transmitting the first standard RF transmit burst, transmit a second standard RF transmit burst from the RF communications terminal 12 to the RF test instrument 14 (Step 304). During calibration operation, synchronize receiving the second standard RF transmit burst based on receiving the first standard RF transmit burst (Step 306). During calibration operation, assimilate the second standard RF transmit burst using the RF test instrument 14 (Step 308). Extract first amplitude information regarding the second standard RF transmit burst from the RF test instrument 14 (Step 310).

The calibration control system 16 may be used to extract the first amplitude information during calibration operation. Determine first AM to AM distortion of the RE communications terminal 12 using the first amplitude information (Step 312). The calibration control system 16 may be used to determine the first AM to AM distortion during calibration operation. Determine AM to AM pre-distortion calibration information AAPDCI (FIG. 2) using the determined first AM to AM distortion (Step 314). The calibration control system 16 (FIG. 1) may be used to determine the AM to AM pre-distortion calibration information AAPDCI during calibration operation. To complete the process, calibrate the RF communications terminal 12 using the AM to AM pre-distortion calibration information AAPDCI (Step 316). The calibration control system 16 (FIG. 1) may be used to calibrate the RF communications terminal 12 during calibration operation by providing the AM to AM pre-distortion calibration information AAPDCI to the RF communications terminal 12.

In one embodiment of the first standard RF transmit burst and the second standard RF transmit burst, the first standard RF transmit burst is not a custom built waveform and the second standard RF transmit burst is not a custom built waveform. In one embodiment of the first standard RF transmit burst and the second standard RF transmit burst, the first standard RF transmit burst is a standard GSM transmit burst and the second standard RF transmit burst is a standard GSM transmit burst. In one embodiment of the first standard RF transmit burst and the second standard RF transmit burst, the first standard RF transmit burst is a single-shot burst, the second standard RF transmit burst is a single-shot burst, and the first amplitude information is a single-shot extraction. In one embodiment of the second standard RF transmit burst, an amplitude of the second standard RF transmit burst is modulated to span an amplitude operating range of the RF communications terminal 12. In one embodiment of the second standard RF transmit burst, an amplitude of the second standard RF transmit burst is modulated based on the AM control signal ARAMP, which may be an amplitude ramp signal. The amplitude ramp signal may be based on a programmable ramp.

In one embodiment of the RF test instrument 14, no custom instrument features of the RF test instrument 14 are used to assimilate the second standard RF transmit burst. In one embodiment of the RF test instrument 14, no custom instrument features of the RF test instrument 14 are used to extract the first amplitude information regarding the second standard RF transmit burst. In one embodiment of the RF test instrument 14, at least one basic signal capture feature of the RF test instrument 14 is used to assimilate the second standard RF transmit burst. In one embodiment of the RF test instrument 14, at least one basic signal capture feature of the RF test instrument 14 is used to extract the first amplitude information regarding the second standard RF transmit burst. In one embodiment of the RF test instrument 14, one basic signal capture feature of the RF test instrument 14 is used to for taking amplitude measurements of the second standard RF transmit burst.

Figure 6:
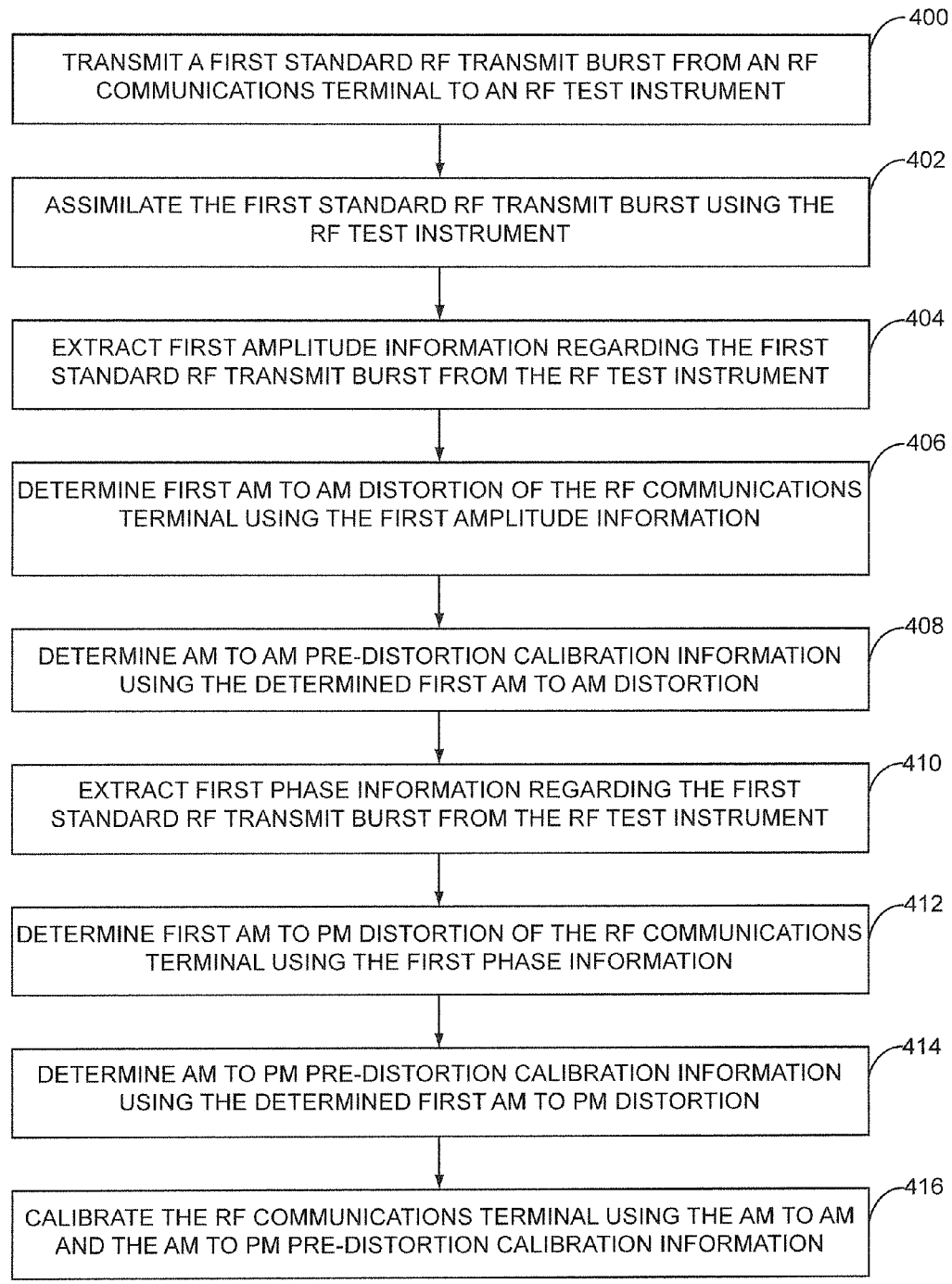
FIG. 6 shows a process for calibrating the RF communications terminal shown in FIG. 1 according to another embodiment of the system.

FIG. 6 shows a process for calibrating the RF communications terminal 12 shown in FIG. 1 according to another embodiment of the system 10. The calibration control system 16 (FIG. 1) may be used to select calibration operation. During calibration operation, transmit a first standard RF transmit burst from the RF communications terminal 12 (FIG. 1) to the RF test instrument 14 (FIG. 1) (Step 400). The first standard RF transmit burst may be transmitted via the polar modulated RF output signal RFOUT (FIG. 1). The first standard RF transmit burst may be transmitted at a first calibration frequency. During calibration operation, assimilate the first standard RF transmit burst using the RF test instrument 14 (Step 402). Extract first amplitude information regarding the first standard RF transmit burst from the RF test instrument 14 (Step 404). The calibration control system 16 may be used to extract the first amplitude information during calibration operation. Determine first AM to AM distortion of the RF communications terminal 12 using the first amplitude information (Step 406). The calibration control system 16 may be used to determine the first AM to AM distortion during calibration operation. Determine AM to AM pre-distortion calibration information AAPDCI (FIG. 2) using the determined first AM to AM distortion (Step 408). The calibration control system 16 (FIG. 1) may be used to determine the AM to AM pre-distortion calibration information AAPDCI during calibration operation. Extract first phase information regarding the first standard RF transmit burst from the RF test instrument 14 (Step 410). The calibration control system 16 may be used to extract the first phase information during calibration operation. Determine first AM to PM distortion of the RF communications terminal 12 using the first phase information (Step 412). The calibration control system 16 may be used to determine the first AM to PM distortion during calibration operation. Determine AM to PM pre-distortion calibration information APPDCI (FIG. 2) using the determined first AM to PM distortion (Step 414). The calibration control system 16 (FIG. 1) may be used to determine the AM to AM pre-distortion calibration information AAPDCI and the AM to PM pre-distortion calibration information APPDCI during calibration operation. To complete the process, calibrate the RF communications terminal 12 using the AM to AM pre-distortion calibration information AAPDCI and the AM to PM pre-distortion calibration information APPDCI (Step 416). The calibration control system 16 (FIG. 1) may be used to calibrate the RF communications terminal 12 during calibration operation by providing the AM to AM pre-distortion calibration information AAPDCI and the AM to PM pre-distortion calibration information APPDCI to the RF communications terminal 12.

In one embodiment of the first standard RF transmit burst, the first standard RF transmit burst is not a custom built waveform. In one embodiment of the first standard RF transmit burst, the first standard RF transmit burst is a standard GSM transmit burst. In one embodiment of the first standard RF transmit burst, the first standard RF transmit burst is a single-shot burst and the first amplitude information is a single-shot extraction. In one embodiment of the first standard RF transmit burst, an amplitude of the first standard RF transmit burst is modulated to span an amplitude operating range of the RF communications terminal 12. In one embodiment of the first standard RF transmit burst, an amplitude of the first standard RF transmit burst is modulated based on the AM control signal ARAMP, which may be an amplitude ramp signal. The amplitude ramp signal may be based on a programmable ramp. In one embodiment of the first standard RF transmit burst, during the first standard RF transmit burst, a phase of the first standard RF transmit burst is not modulated.

In one embodiment of the RF test instrument 14, no custom instrument features of the RF test instrument 14 are used to assimilate the first standard RF transmit burst. In one embodiment of the RF test instrument 14, no custom instrument features of the RF test instrument 14 are used to extract the first amplitude information regarding the first standard RF transmit burst. In one embodiment of the RF test instrument 14, no custom instrument features of the RF test instrument 14 are used to extract the first phase information regarding the first standard RF transmit burst. In one embodiment of the RF test instrument 14, at least one basic signal capture feature of the RF test instrument 14 is used to assimilate the first standard RF transmit burst. In one embodiment of the RF test instrument 14, at least one basic signal capture feature of the RF test instrument 14 is used to extract the first amplitude information regarding the first standard RF transmit burst. In one embodiment of the RF test instrument 14, one basic signal capture feature of the RF test instrument 14 is used to for taking amplitude measurements of the first standard RF transmit burst. In one embodiment of the RF test instrument 14, at least one basic signal capture feature of the RF test instrument 14 is used to extract the first phase information regarding the first standard RF transmit burst.

In one embodiment of the RF test instrument 14, one basic signal capture feature of the RF test instrument 14 is used for taking amplitude measurements of the first standard RF transmit burst and another basic signal capture feature of the RF test instrument 14 is used for taking phase measurements of the first standard RF transmit burst.

There are several desirable characteristics of the first standard RF transmit burst. One embodiment of the present invention may include any or all of the following characteristics. The AM control signal ARAMP that provides the first standard RF transmit burst is generated internally to the RF communications terminal 12 (FIG. 1). The first standard RF transmit burst covers the full dynamic range of the RF power amplifier 24 (FIG. 2) with adequate resolution for calibration. The first standard RF transmit burst has a waveshape that facilitates time alignment between the AM control signal ARAMP and the measured polar modulated RF output signal RFOUT without any external or separate synchronization methods. The first standard RF transmit burst is short in duration to minimize the number of samples needed to be collected by the RF test instrument 14 (FIG. 1) and transferred to the calibration control system 16 (FIG. 1). In this regard, FIGS. 7-10 below show different waveforms associated with the first standard RF transmit burst.

Figure 7:
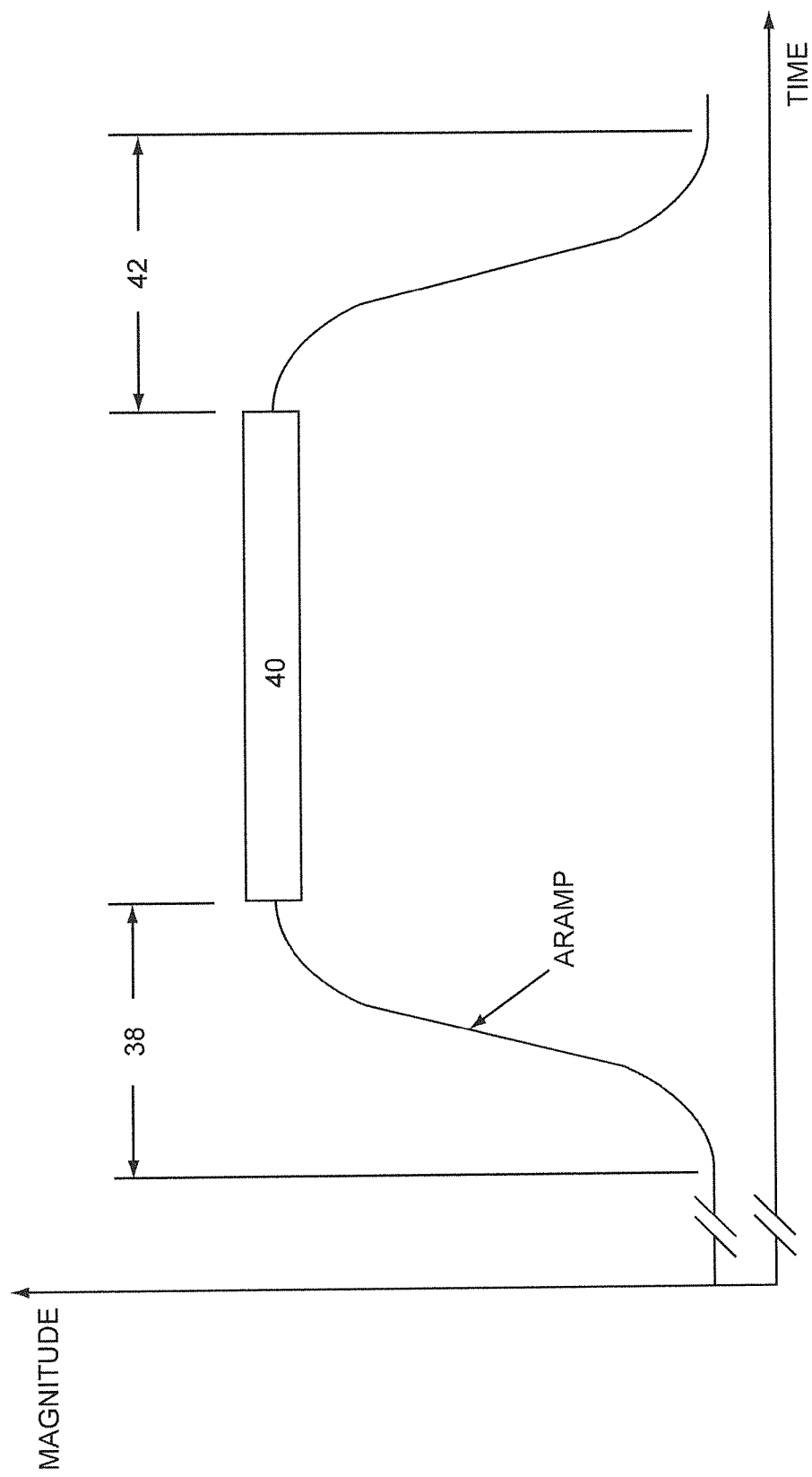
FIG. 7 is a graph illustrating an amplitude modulation (AM) control signal shown in FIG. 2 during a standard Global System for Mobile Communications (GSM) transmit burst, according to one embodiment of the AM control signal.

FIG. 7 is a graph illustrating the AM control signal ARAMP shown in FIG. 2 during a standard GSM transmit burst, according to one embodiment of the AM control signal ARAMP. The standard GSM transmit burst may provide the first standard RF transmit burst according to one embodiment of the first standard RF transmit burst. The AM control signal ARAMP during the standard GSM transmit burst has a ramp-up portion 38 followed by a normal data transmit burst 40, which is followed by a ramp-down portion 42. The ramp-up portion 38 and the ramp-down portion 42 may assure full dynamic range of the RF power amplifier 24.

Figure 8:
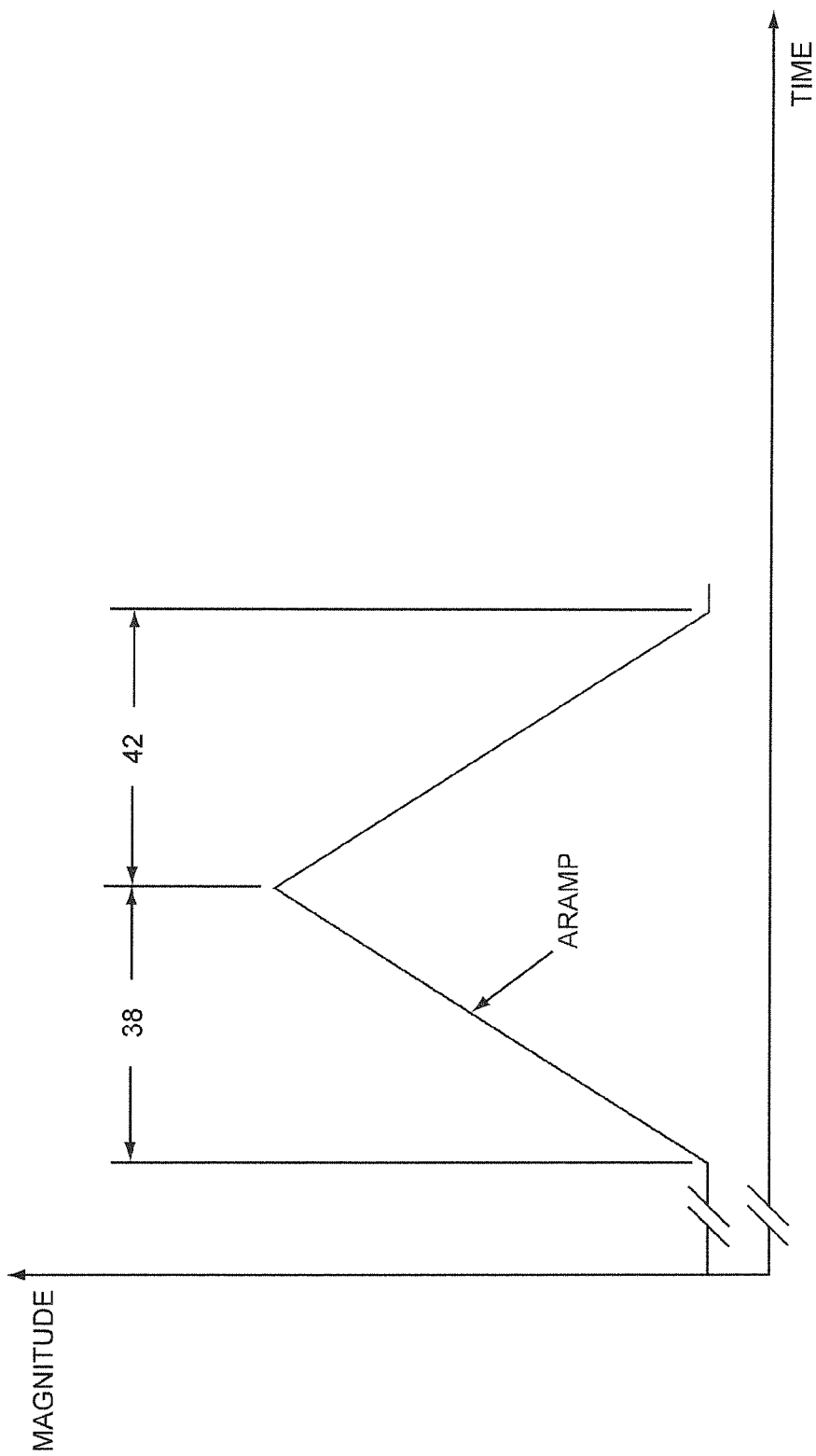
FIG. 8 is a graph illustrating the AM control signal shown in FIG. 2 during a pre-distortion calibration transmit burst while calibrating the RF communications terminal, according to an alternate embodiment of the AM control signal.

As such, FIG. 8 is a graph illustrating the AM control signal ARAMP shown in FIG. 2 during a pre-distortion calibration transmit burst while calibrating the RF communications terminal 12, according to an alternate embodiment of the AM control signal ARAMP. To minimize the duration of the standard RF transmit burst, the AM control signal ARAMP includes an equilateral saw-tooth waveform that is constructed with the ramp-up portion 38 immediately followed by the ramp-down portion 42. The normal data transmit burst 40 is omitted. Other embodiments of the AM control signal ARAMP may include a portion between the ramp-up portion 38 and the ramp-down portion 42 or may have a waveshape other than an equilateral saw-tooth. On/Off switching transients of the RF power amplifier 24 may be minimized by carefully controlling the ramp-up portion 38 and the ramp-down portion 42 to provide a smooth transition between off-states and on-states of the RF power amplifier 24. Some embodiments of the RF communications terminal 12 may include a ramp table, which may be used to provide the AM control signal ARAMP. The shape of the AM control signal ARAMP may be defined by sequential entries in the ramp table. Therefore, the shape of the AM control signal ARAMP during the standard RF transmit burst may be defined by the ramp table. The ramp table allows use of a programmable ramp, which may be based on the ramp profile. The ramp profile may include the ramp-up portion 38, the ramp-down portion 42, or both. To minimize switching transients, the ramp profile may be based on a raised-cosine waveform. Alternate embodiments of the AM control signal ARAMP may have waveforms of any shape.

Figure 9:
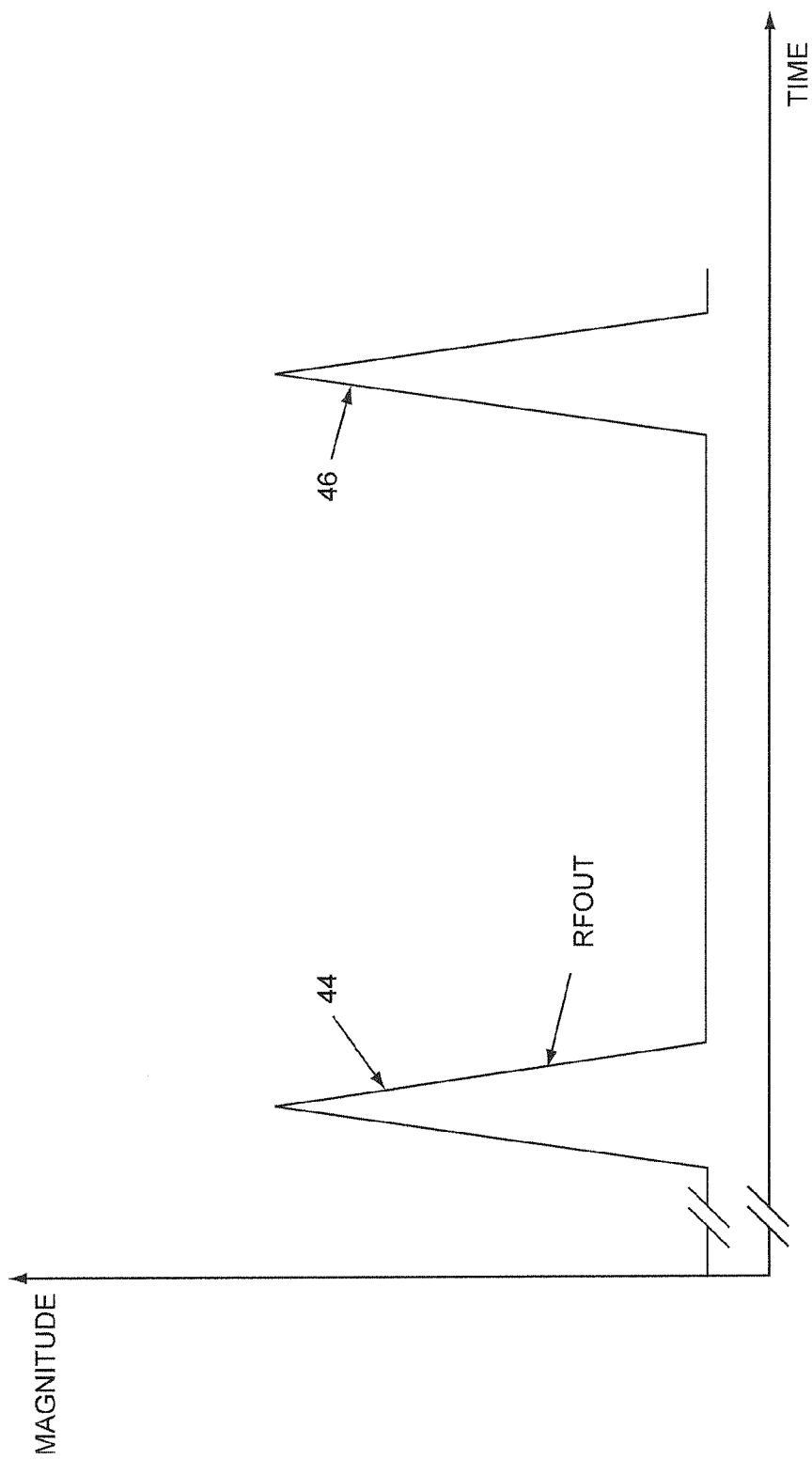
FIG. 9 is a graph illustrating a polar modulated RF output signal shown in FIG. 1 during a pre-distortion calibration transmit burst while calibrating the RF communications terminal, according to one embodiment of the polar modulated RF output signal.

FIG. 9 is a graph illustrating the polar modulated RF output signal RFOUT shown in FIG. 1 during a pre-distortion calibration transmit burst while calibrating the RF communications terminal 12, according to one embodiment of the polar modulated RF output signal RFOUT. The polar modulated RF output signal RFOUT illustrated in FIG. 9 may be associated with the calibration process illustrated in FIG. 5. During the calibration process, the polar modulated RF output signal RFOUT may have a first burst 44 followed by a second burst 46. The first burst 44 may correlate with the first standard RF transmit burst referred to in Step 300 (FIG. 5) and the second burst 46 may correlate with the second standard RF transmit burst referred to in Step 304 (FIG. 5). The first burst 44 may be used to trigger the RF test instrument 14, such that the second burst 46 is captured by the RF test instrument 14. Capturing the second burst 46 may be based on a coarse windowing algorithm, which establishes a coarse window based on the second burst 46. In other words, the first burst 44 triggers the RF test instrument 14 to start looking for the second burst 46 and the coarse windowing algorithm locates the second burst 46 and establishes the coarse window based on the second burst 46. Alternate embodiments of the polar modulated RF output signal RFOUT may have any waveform.

Figure 10:
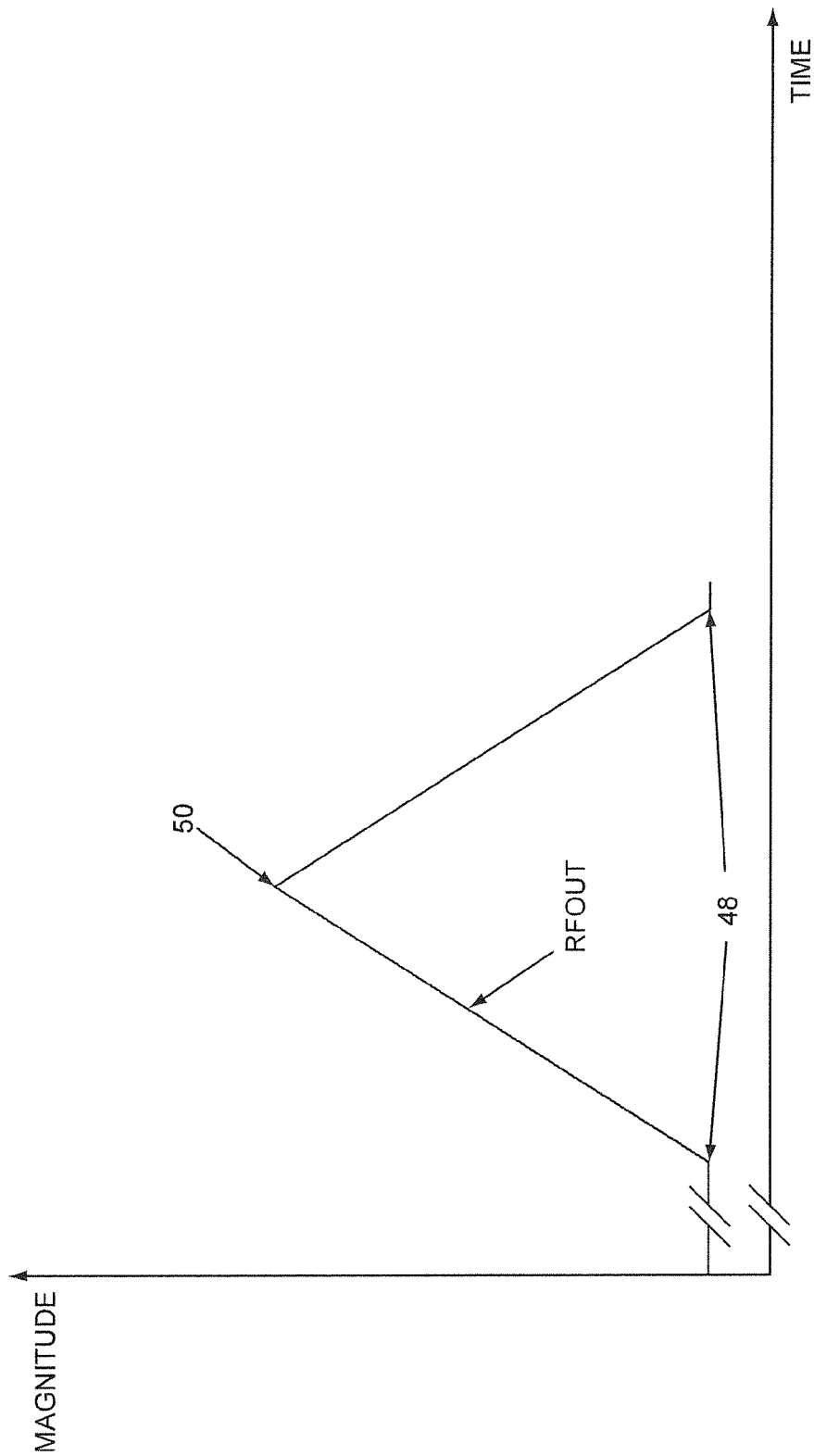
FIG. 10 is a graph illustrating a second burst of the polar modulated RF output signal shown in FIG. 9.

FIG. 10 is a graph illustrating the second burst 46 of the polar modulated RF output signal RFOUT shown in FIG. 9. Once the coarse window is established, a fine windowing algorithm may be used to establish a fine window based on the second burst 46. The fine window may allow the details of the second burst 46 to be time aligned with the ramp profile from which the second burst 46 was created. Then, the second burst 46 may be compared to the ramp profile to determine the first AM to AM distortion. To facilitate the time alignment, the second burst 46 of the polar modulated RF output signal RFOUT may have at least one local minimum 48 and at least one local maximum 50, both of which are correlated with at least one local minimum 48 (not shown) and at least one local maximum 50 (not shown) in the ramp profile. For example, in one embodiment of the calibration process illustrated in FIG. 5, part of the process step (Step 312, FIG. 5) to determine the AM to AM distortion, may include time aligning the ramp profile to the first amplitude information based on locating at least a first point in the ramp profile and locating at least a corresponding first point in the first amplitude information, such that the at least the first point in the ramp profile includes at least one local minimum 48, at least one local maximum 50, or both.

Figure 11:
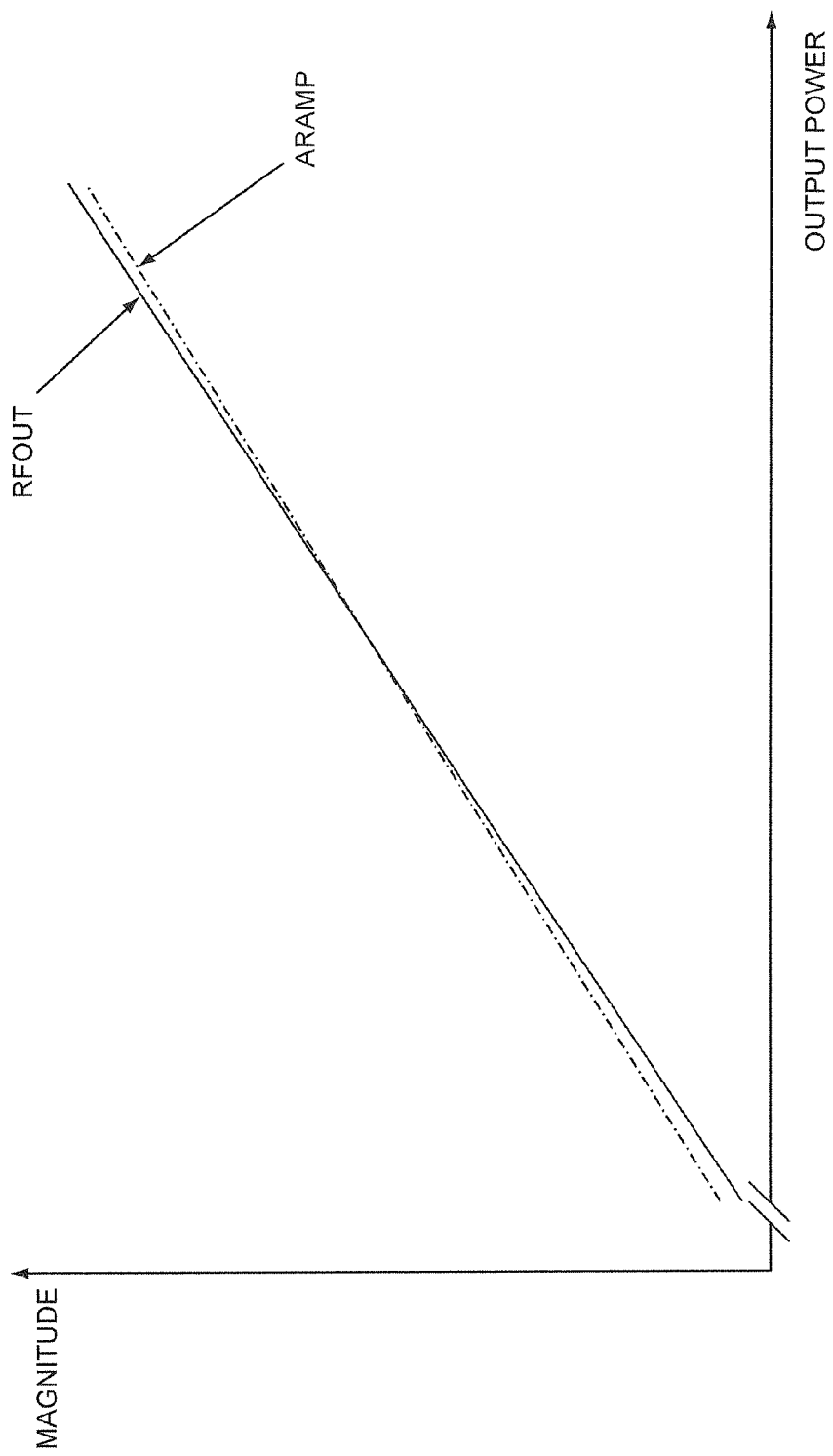
FIG. 11 is a graph showing the relationship of the magnitudes of the polar modulated RF output signal and the AM control signal to the output power from the RF communications terminal, according to one embodiment of the RF communications terminal.

FIG. 11 is a graph showing the relationship of the magnitudes of the polar modulated RF output signal RFOUT and the AM control signal ARAMP to the output power from the RF communications terminal 12, according to one embodiment of the RF communications terminal 12. The polar modulated RF output signal RFOUT and the AM control signal ARAMP are scaled such that if the RF communications terminal 12 had no AM to AM distortion, the polar modulated RF output signal RFOUT and the AM control signal ARAMP illustrated in FIG. 11 would lie on top of one another. Any differences between the polar modulated RF output signal RFOUT and the AM control signal ARAMP are indicative of AM to AM distortion of the RF communications terminal 12. Ideally, once the AM to AM pre-distortion of the RF communications terminal 12 is calibrated, the polar modulated RF output signal RFOUT and the AM control signal ARAMP illustrated in FIG. 11 would lie on top of one another.

Figure 12:
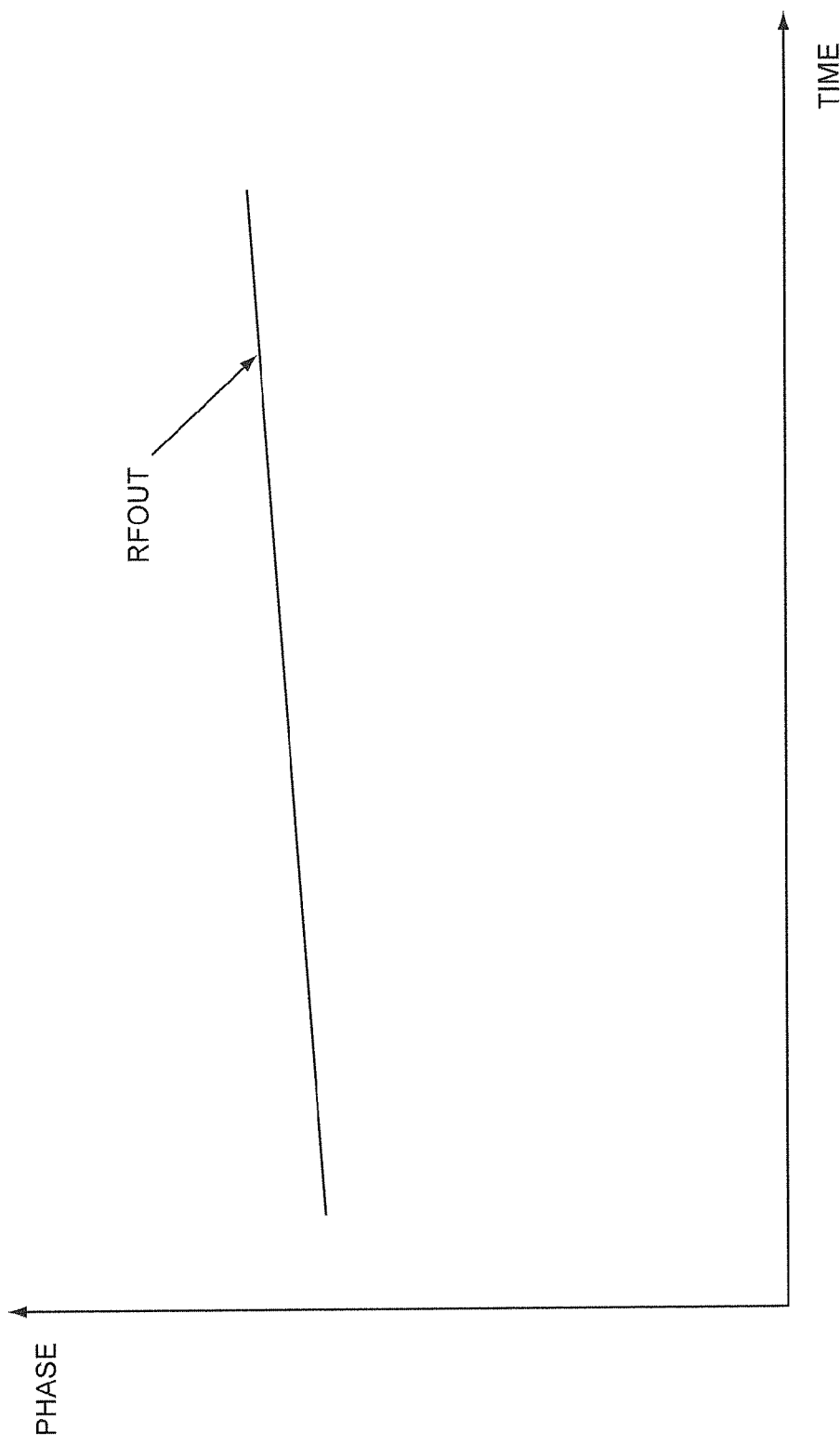
FIG. 12 is a graph illustrating the polar modulated RF output signal shown in FIG. 1 during a pre-distortion calibration transmit burst while calibrating the RF communications terminal, according to an additional embodiment of the polar modulated RF output signal.

FIG. 12 is a graph illustrating the polar modulated RF output signal RFOUT shown in FIG. 1 during the first standard RF transmit burst while calibrating the RF communications terminal 12, according to an additional embodiment of the polar modulated RF output signal RFOUT. The polar modulated RF output signal RFOUT shown in FIG. 12 is not phase modulated. Therefore, if a frequency reference in the RF test instrument 14 is exactly frequency matched to the frequency of the polar modulated RF output signal RFOUT during the first standard RF transmit burst, then the phase of the polar modulated RF output signal RFOUT as measured by the RF test instrument 14 will remain constant. Such a polar modulated RF output signal RFOUT would be indicated by a perfectly horizontal line. However, a line having a non-zero slope, as shown in FIG. 12, illustrates a constant change in phase per unit time, which is indicative of a frequency error between the RF test instrument 14 and the polar modulated RF output signal RFOUT. For accurate determination of AM to PM distortion, such a frequency error must be accounted for in the determination of AM to PM distortion. In one embodiment, the frequency error may be measured and then subtracted out. For example, in the calibration process illustrated in FIG. 6, the method step to determine the first AM to PM distortion (Step 412) may include correcting for frequency error between the first standard RF transmit burst and the RF test instrument 14.

Figure 13:
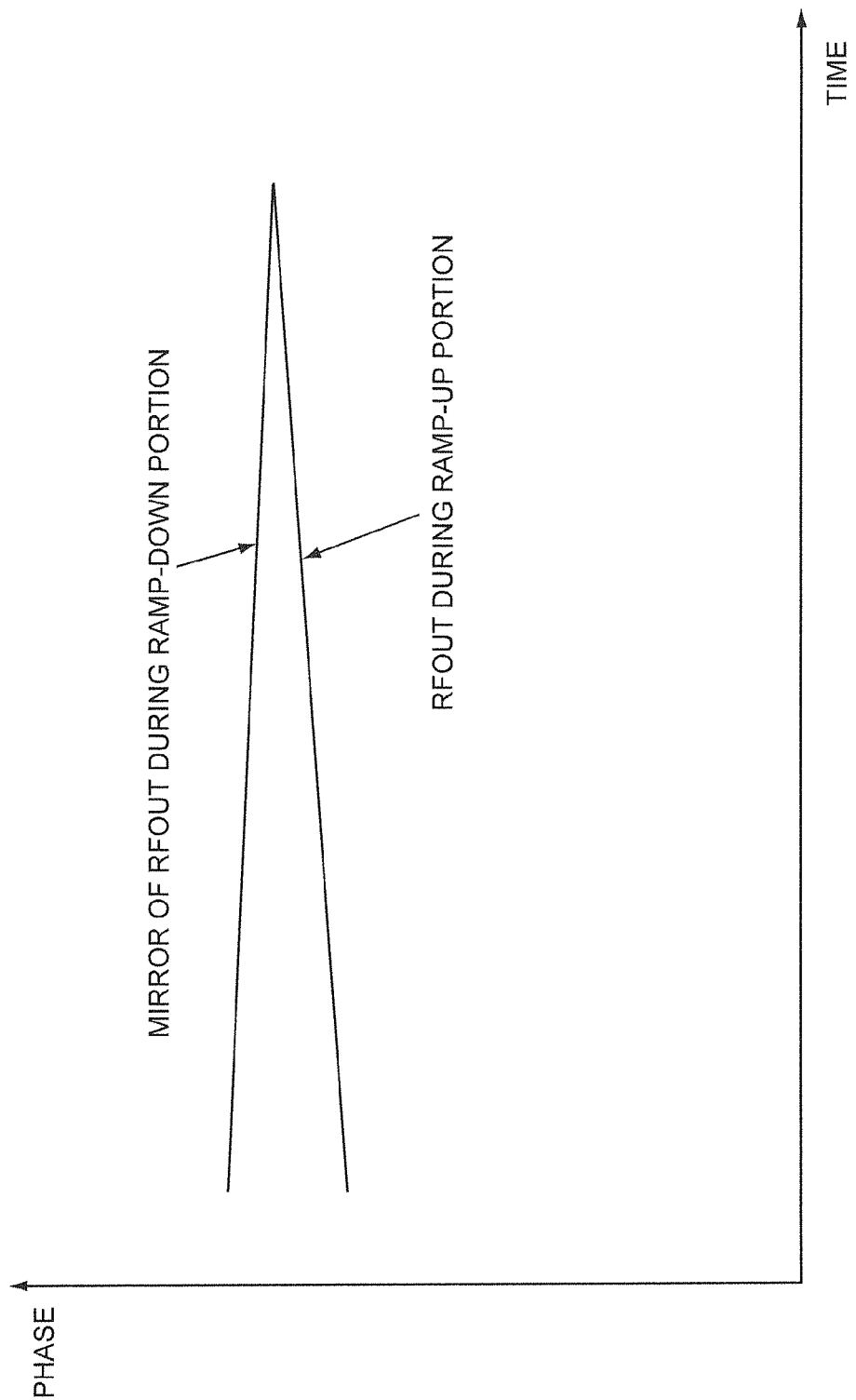
FIG. 13 is a graph illustrating the polar modulated RF output signal shown in FIG. 1 during a pre-distortion calibration transmit burst while calibrating the RF communications terminal, according to an another embodiment of the polar modulated RF output signal.

FIG. 13 is a graph illustrating the polar modulated RF output signal RFOUT shown in FIG. 1 during a pre-distortion calibration transmit burst while calibrating the RF communications terminal 12, according to an another embodiment of the polar modulated RF output signal RFOUT. FIG. 13 illustrates an alternate embodiment for correcting the frequency error illustrated in FIG. 12. The polar modulated RF output signal RFOUT illustrated in FIG. 13 shows the polar modulated RF output signal RFOUT during the ramp-up portion 38 and a mirror image of the polar modulated RF output signal RFOUT during the ramp-down portion 42 overlaying the polar modulated RF output signal RFOUT during the ramp-up portion 38. If the frequency error during the ramp-up portion 38 is equal to the frequency error during the ramp-down portion 42, then by combining the polar modulated RF output signal RFOUT during the ramp-up portion 38 with the mirror image of the polar modulated RF output signal RFOUT during the ramp-down portion 42, the frequency error is cancelled.

Figure 14:
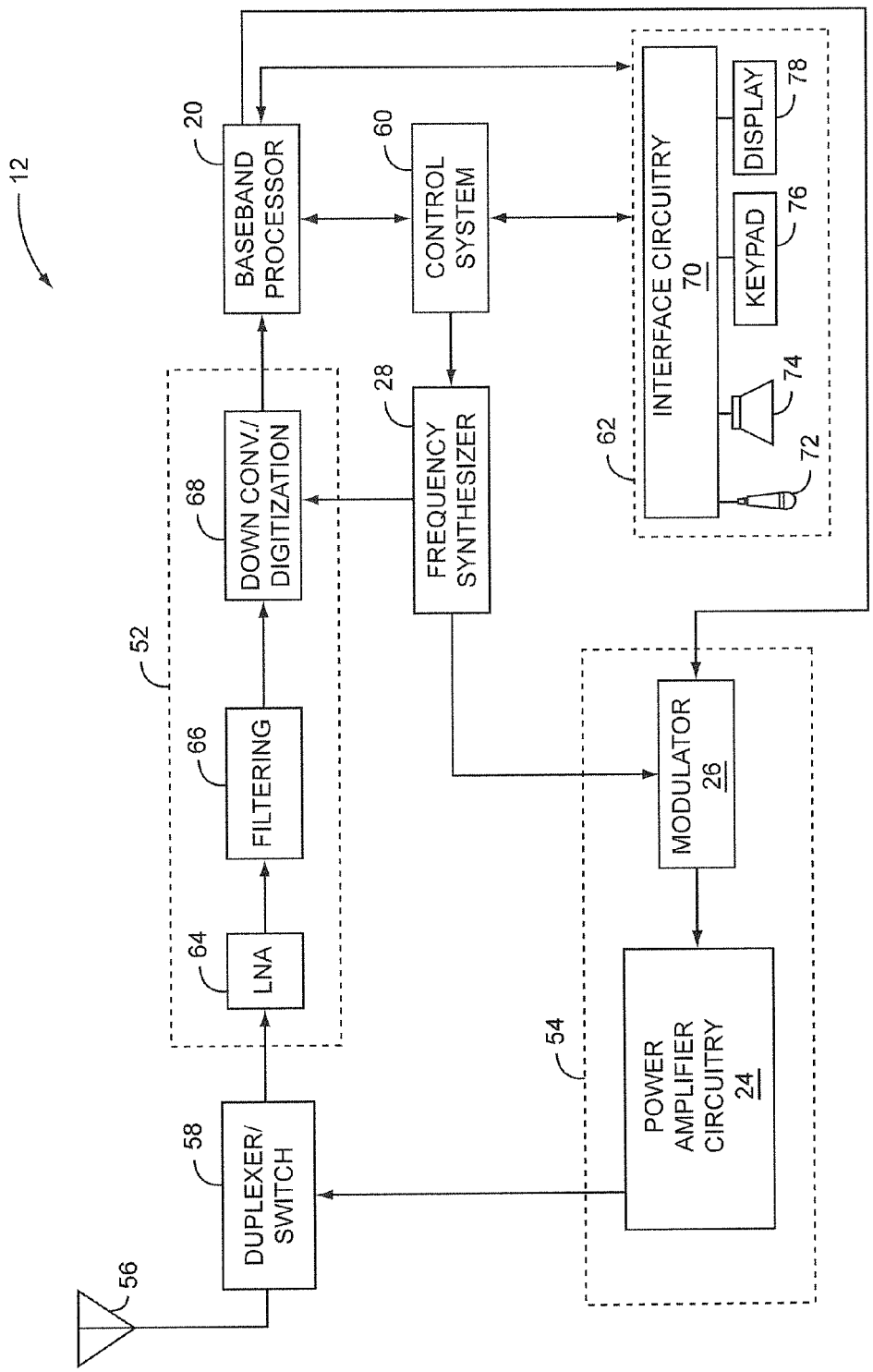
FIG. 14 shows an application example of the RF communications terminal illustrated in FIG. 1 according to one embodiment of the RF communications terminal.

The basic architecture of an application example of the RF communications terminal 12 is illustrated in FIG. 14. The RF communications terminal 12 may include a receiver front end 52, a radio frequency transmitter section 54, an antenna 56, a duplexer or switch 58, the baseband processor 20, a control system 60, the frequency synthesizer 28, and an interface 62. The receiver front end 52 receives information bearing radio frequency signals from one or more remote transmitters provided by a base station (not shown). A low noise amplifier (LNA) 64 amplifies the signal. A filter circuit 66 minimizes broadband interference in the received signal, while down conversion and digitization circuitry 68 down converts the filtered, received signal to an intermediate or baseband frequency signal, which is then digitized into one or more digital streams. The receiver front end 52 typically uses one or more mixing frequencies generated by the frequency synthesizer 28. The baseband processor 20 processes the digitized received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data, which may represent voice, data, or control information, from the control system 60, which it encodes for transmission. The encoded data is output to the transmitter 54, where it is used by a modulator 26 to modulate a carrier signal that is at a desired transmit frequency. The power amplifier circuitry 24 amplifies the modulated carrier signal to a level appropriate for transmission, and delivers the amplified and modulated carrier signal to the antenna 56 through the duplexer or switch 58.

A user may interact with the RF communications terminal 12 via the interface 62, which may include interface circuitry 70 associated with a microphone 72, a speaker 74, a keypad 76, and a display 78. The interface circuitry 70 typically includes analog-to-digital converters, digital-to-analog converters, amplifiers, and the like. Additionally, it may include a voice encoder/decoder, in which case it may communicate directly with the baseband processor 20. The microphone 72 will typically convert audio input, such as the user's voice, into an electrical signal, which is then digitized and passed directly or indirectly to the baseband processor 20. Audio information encoded in the received signal is recovered by the baseband processor 20, and converted by the interface circuitry 70 into an analog signal suitable for driving the speaker 74. The keypad 76 and display 78 enable the user to interact with the RF communications terminal 12, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    transmitting a first standard radio frequency (RF) transmit burst from an RF communications terminal to an RF test instrument, wherein the amplitude of the first standard RF transmit burst is based on a programmable ramp including a ramp-up portion immediately followed by a ramp-down portion;
    assimilating the first standard RF transmit burst using the RF test instrument;
    extracting first amplitude information regarding the first standard RF transmit burst from the RF test instrument;
    determining first amplitude modulation (AM) to AM distortion of the RF communications terminal using the first amplitude information;
    determining AM to AM pre-distortion calibration information using the determined first AM to AM distortion; and
    calibrating the RF communications terminal using the AM to AM pre-distortion calibration information.

2. The method of claim 1 wherein the first standard RF transmit burst is not a custom built waveform.

3. The method of claim 1 wherein the first standard RF transmit burst is a standard Global System for Mobile Communications (GSM) transmit burst.

4. The method of claim 1 wherein the first standard RF transmit burst is a single-shot burst and the first amplitude information is a single-shot extraction.

5. The method of claim 1 further comprising:
    transmitting a second standard RF transmit burst from the RF communications terminal to the RF test instrument before the transmitting the first standard RF transmit burst;
    receiving the second standard RF transmit burst using the RF test instrument; and
    synchronizing receiving the first standard RF transmit burst based on the receiving the second standard RF transmit burst.

6. The method of claim 1 wherein the RF test instrument is commercially available.

7. The method of claim 6 wherein no custom instrument features of the RF test instrument are used for the assimilating and the extracting.

8. The method of claim 6 wherein at least one basic signal capture feature of the RF test instrument is used for the assimilating and the extracting.

9. The method of claim 8 wherein one of the at least one basic signal capture feature is used for taking amplitude measurements of the first standard RF transmit burst.

10. The method of claim 9 wherein another of the at least one basic signal capture feature is used for taking phase measurements of the first standard RF transmit burst.

11. The method of claim 1 wherein the transmitting the first standard RF transmit burst is at a first calibration frequency.

12. The method of claim 1 further comprising:
    transmitting a plurality of standard RF transmit bursts from the RF communications terminal to the RF test instrument, such that the plurality of standard RF transmit bursts includes the first standard RF transmit burst;
    assimilating the plurality of standard RF transmit bursts using the RF test instrument;
    extracting amplitude information regarding each of the plurality of standard RF transmit bursts from the RF test instrument; and
    determining AM to AM distortion of the RF communications terminal for each of the plurality of standard RF transmit bursts using the amplitude information regarding each of the plurality of standard RF transmit bursts, such that the determining the AM to AM pre-distortion calibration information further uses the determined AM to AM distortion of the RF communications terminal for each of the plurality of standard RF transmit bursts.

13. The method of claim 12 wherein transmitting each of the plurality of standard RF transmit bursts is at a corresponding calibration frequency.

14. The method of claim 1 wherein during the first standard RF transmit burst, an amplitude of the first standard RF transmit burst is modulated to span an amplitude operating range of the RF communications terminal.

15. The method of claim 1 wherein the programmable ramp is based on a ramp profile and the determining the first AM to AM distortion is based on differences between the first amplitude information and the ramp profile.

16. The method of claim 15 wherein the ramp profile includes a ramp-up portion and a ramp-down portion.

17. The method of claim 15 wherein the ramp profile is based on a raised-cosine waveform.

18. The method of claim 15 wherein the ramp profile is time aligned to the first amplitude information based on locating at least a first point in the ramp profile and locating at least a corresponding first point in the first amplitude information, such that the at least the first point in the ramp profile includes at least one of a local minimum and a local maximum.

19. The method of claim 1 wherein during normal operation, the RF communications terminal transmits polar modulated RF signals, which are pre-distorted based on the AM to AM pre-distortion calibration information.

20. The method of claim 1 further comprising:
   extracting first phase information regarding the first standard RF transmit burst from the RF test instrument;
   determining first AM to phase modulation (PM) distortion of the RF communications terminal using the first phase information;
   determining AM to PM pre-distortion calibration information using the determined first AM to PM distortion; and
   calibrating the RF communications terminal using the AM to PM pre-distortion calibration information.

21. The method of claim 20 wherein during the first standard RF transmit burst, a phase of the first standard RF transmit burst is not modulated.

22. The method of claim 20 wherein the determining first AM to PM distortion includes correcting for frequency error between the first standard RF transmit burst and the RF test instrument.

23. The method of claim 20 wherein during normal operation, the RF communications terminal transmits polar modulated RF signals, which are pre-distorted based on the AM to AM pre-distortion calibration information and the AM to PM pre-distortion calibration information.

24. A system comprising:
   an RF communications terminal adapted to during calibration operation transmit a first standard radio frequency (RF) transmit burst to an RF test instrument, wherein the amplitude of the first standard RF transmit burst is based on a programmable ramp including a ramp-up portion immediately followed by a ramp-down portion;
   the RF test instrument adapted to during the calibration operation assimilate the first standard RF transmit burst; and
   a calibration control system adapted to:
      select the calibration operation;
      during the calibration operation, extract first amplitude information regarding the first standard RF transmit burst from the RF test instrument;
      during the calibration operation, determine first amplitude modulation (AM) to AM distortion of the RF communications terminal using the first amplitude information;
      during the calibration operation, determine AM to AM pre-distortion calibration information using the determined first AM to AM distortion; and
      during the calibration operation, calibrate the RF communications terminal using the AM to AM pre-distortion calibration information.

* * * * *

UNITED STATES PATENT AND TRADEMARK OFFICE
CERTIFICATE OF CORRECTION

PATENT NO.       : 8,913,969 B1
APPLICATION NO.  : 12/785027
DATED            : December 16, 2014
INVENTOR(S)      : Hirofumi Honjo et al.

Page 1 of 1

It is certified that error appears in the above-identified patent and that said Letters Patent is hereby corrected as shown below:

In the Specification

In column 7, at line 4, replace "RE" with --RF--

In column 8, at line 35, replace "RE" with --RF--

In column 9, at line 54, replace "RE" with --RF--

Signed and Sealed this
Ninth Day of June, 2015

Michelle K. Lee
*Director of the United States Patent and Trademark Office*